US012676190B2

(12) United States Patent
Diep et al.

(10) Patent No.: US 12,676,190 B2
(45) Date of Patent: Jul. 7, 2026

(54) DRAIN-SIDE WORDLINE VOLTAGE BOOSTING TO REDUCE LATERAL ELECTRON FIELD DURING A PROGRAMMING OPERATION

(71) Applicant: Micron Technology, Inc., Boise, ID (US)

(72) Inventors: Vinh Quang Diep, Hayward, CA (US); Ching-Huang Lu, Fremont, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 18/411,532

(22) Filed: Jan. 12, 2024

(65) Prior Publication Data

US 2024/0249776 A1     Jul. 25, 2024

Related U.S. Application Data

(60) Provisional application No. 63/440,994, filed on Jan. 25, 2023.

(51) Int. Cl.
    *G11C 16/10*          (2006.01)
    *G11C 16/08*          (2006.01)
    *G11C 16/12*          (2006.01)

(52) U.S. Cl.
    CPC ............ *G11C 16/102* (2013.01); *G11C 16/08* (2013.01); *G11C 16/12* (2013.01)

(58) Field of Classification Search
    None
    See application file for complete search history.

(56) References Cited

U.S. PATENT DOCUMENTS

| | | | |
|---|---|---|---|
| 2008/0049494 A1* | 2/2008 | Aritome | G11C 16/3418 365/185.02 |
| 2008/0159003 A1* | 7/2008 | Dong | G11C 11/5628 365/185.25 |
| 2014/0211563 A1* | 7/2014 | Chang | G11C 16/3427 365/185.03 |

* cited by examiner

*Primary Examiner* — Alfredo Bermudez Lozada
(74) *Attorney, Agent, or Firm* — Lowenstein Sandler LLP

(57)                ABSTRACT

A request to execute a programming operation to program a set of memory cells associated with a target wordline of a memory device is identified. At a first time during application of a programming voltage to the target wordline, causing a first adjusted pass through voltage to be applied to a first portion of a first set of drain-side wordlines of the memory device. At a second time during application of the programming voltage to the target wordline, causing a second pass through voltage to be applied to a second portion of the first set of drain-side wordlines and to one or more source-side wordlines of the memory device, where the first adjusted pass through voltage is greater than the second pass through voltage.

17 Claims, 13 Drawing Sheets

Figure 3:
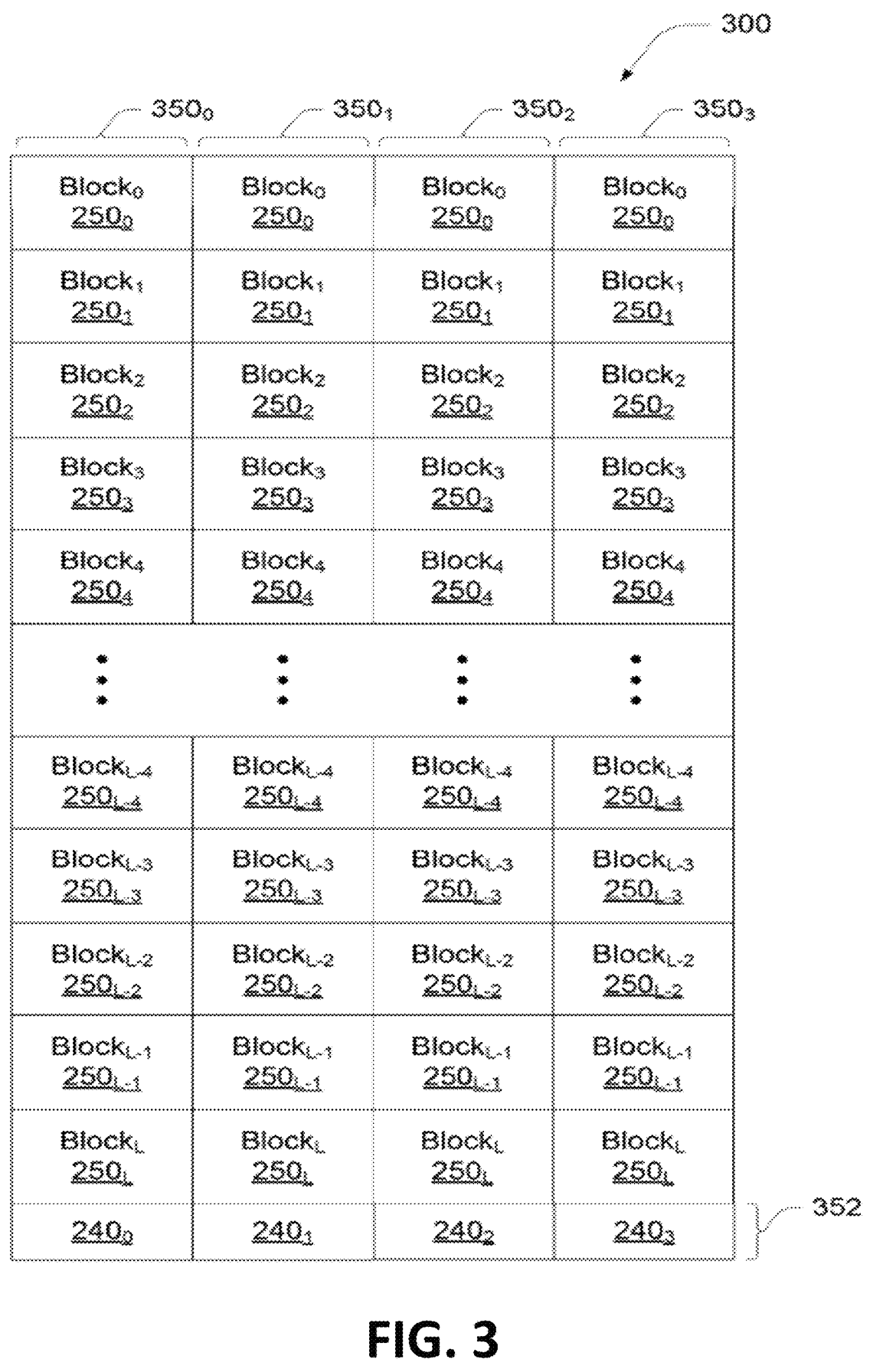

| $350_0$ | $350_1$ | $350_2$ | $350_3$ |
|---|---|---|---|
| $Block_0$ $250_0$ | $Block_0$ $250_0$ | $Block_0$ $250_0$ | $Block_0$ $250_0$ |
| $Block_1$ $250_1$ | $Block_1$ $250_1$ | $Block_1$ $250_1$ | $Block_1$ $250_1$ |
| $Block_2$ $250_2$ | $Block_2$ $250_2$ | $Block_2$ $250_2$ | $Block_2$ $250_2$ |
| $Block_3$ $250_3$ | $Block_3$ $250_3$ | $Block_3$ $250_3$ | $Block_3$ $250_3$ |
| $Block_4$ $250_4$ | $Block_4$ $250_4$ | $Block_4$ $250_4$ | $Block_4$ $250_4$ |
| $\vdots$ | $\vdots$ | $\vdots$ | $\vdots$ |
| $Block_{L-4}$ $250_{L-4}$ | $Block_{L-4}$ $250_{L-4}$ | $Block_{L-4}$ $250_{L-4}$ | $Block_{L-4}$ $250_{L-4}$ |
| $Block_{L-3}$ $250_{L-3}$ | $Block_{L-3}$ $250_{L-3}$ | $Block_{L-3}$ $250_{L-3}$ | $Block_{L-3}$ $250_{L-3}$ |
| $Block_{L-2}$ $250_{L-2}$ | $Block_{L-2}$ $250_{L-2}$ | $Block_{L-2}$ $250_{L-2}$ | $Block_{L-2}$ $250_{L-2}$ |
| $Block_{L-1}$ $250_{L-1}$ | $Block_{L-1}$ $250_{L-1}$ | $Block_{L-1}$ $250_{L-1}$ | $Block_{L-1}$ $250_{L-1}$ |
| $Block_L$ $250_L$ | $Block_L$ $250_L$ | $Block_L$ $250_L$ | $Block_L$ $250_L$ |
| $240_0$ | $240_1$ | $240_2$ | $240_3$ |

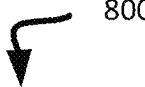

Identify a request to execute a programming operation to program a set of memory cells associated with a target wordline of a memory device
810

Cause, at a first time during application of a programming voltage to the target wordline, a first adjusted pass through voltage to be applied to a first portion of a first set of drain-side wordlines of the memory device
820

Cause, at a second time during application of the programming pulse to the target wordline, a second pass through voltage to be applied to a second portion of the first set of drain-side wordlines and one or more source-side wordlines of the memory device, where the first adjusted pass through voltage is greater than the second pass through voltage
830

DRAIN-SIDE WORDLINE VOLTAGE BOOSTING TO REDUCE LATERAL ELECTRON FIELD DURING A PROGRAMMING OPERATION

CROSS-REFERENCE TO RELATED APPLICATION

This application claims the benefit of U.S. Provisional Application No. 63/440,994, filed Jan. 25, 2023, which is hereby incorporated herein by reference in its entirety.

TECHNICAL FIELD

Embodiments of the disclosure relate generally to memory sub-systems, and more specifically, relate to boosting a voltage applied to one or more drain-side wordlines to reduce lateral electron field during a programming operation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A-2D are schematics of portions of an array of memory cells as could be used in a memory of the type described with reference to FIG. 1B, in accordance with one or more embodiments of the present disclosure.

FIG. 3 is a block schematic of a portion of an array of memory cells as could be used in a memory of the type described with reference to FIG. 1B, in accordance with one or more embodiments of the present disclosure.

FIG. 6 illustrates example waveforms associated with managing pass through voltage levels applied to drain-side wordlines and source-side wordlines during execution of a programming operation to program one or more memory cells of a target wordline of a memory device, in accordance with one or more embodiments of the present disclosure.

FIG. 7 illustrates example waveforms associated with managing pass through voltage levels applied to drain-side wordlines and source-side wordlines during execution of a programming operation to program one or more memory cells of a target wordline of a memory device, in accordance with one or more embodiments of the present disclosure, FIG. 8 is a flow diagram of an example method to manage pass through voltage levels applied to drain-side and source-side wordlines during execution of a programming operation to program one or more memory cells of a target wordline, in accordance with one or more embodiments of the present disclosure.

DETAILED DESCRIPTION

Figure 1A:
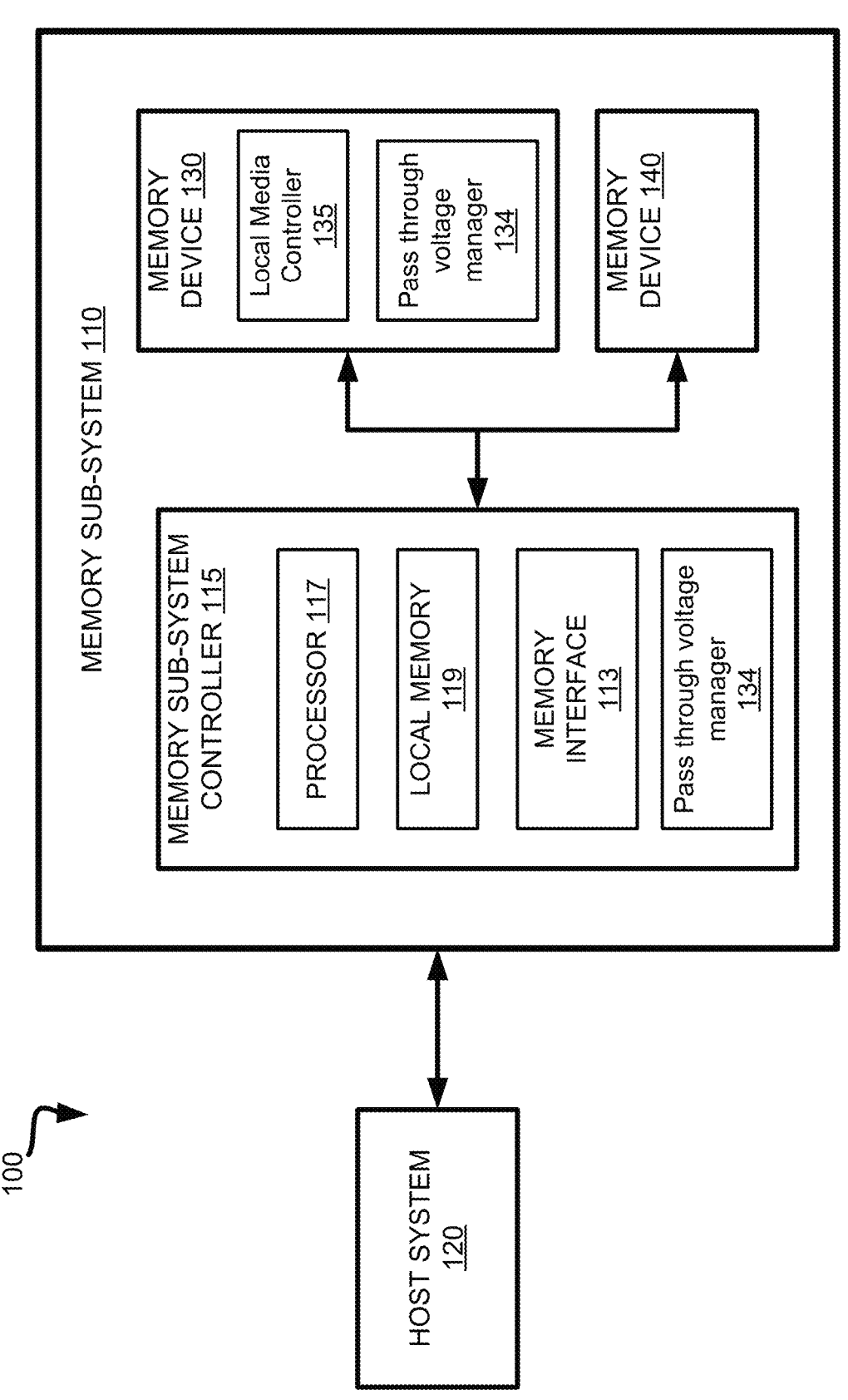
FIG. 1A illustrates an example computing system that includes a memory sub-system, in accordance with one or more embodiments of the present disclosure.

Aspects of the present disclosure are directed to boosting a voltage applied to one or more drain-side wordlines to reduce lateral electron field during a programming operation in a memory sub-system. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., a pass through voltage, which is less than the programming voltage. After each programming pulse, or after a number of programming pulses, a program verify operation can be performed to determine if the threshold voltage of the one or more memory cells has increased to a desired programming level.

Cells of a memory array that are selected for execution of a memory access operation (e.g., a read operation, a program operation, an erase operation) can be referred to target cells connected to a target wordline. The target cells can be adjacent to cells connected to at least one wordline neighboring the target wordline ("adjacent wordline"). For example, the at least one adjacent wordline can be a single wordline neighboring the target wordline or a pair of wordlines neighboring the target wordline. Illustratively, the target wordline can be referred to as an nth wordline (WLn), and the at least one adjacent wordline can include at least one of adjacent wordline n−1 (WLn−1) or adjacent wordline n+1 (WLn+1). For example, in a 3D memory device, the set of adjacent wordlines can include a wordline located directly above the target wordline and/or a wordline located directly below the target wordline.

Each target cell has a respective group of adjacent cells. Each group of adjacent cells includes at least one cell that neighbors its respective target cell (e.g., one cell connected to WLn−1 and/or one cell connected to WLn+1). More specifically, each target cell can be connected to the same bitline as each cell of the respective group of adjacent cells, such that the target cell and the cells of the respective group of adjacent cells are within the same string. Accordingly, each group of adjacent cells can include a single adjacent cell, or a pair of adjacent cells connected to a same bitline as a respective target cell.

A cell (e.g., NAND cell) of a block can store data in the form of the threshold voltage, which is a lowest voltage at which the cell can be activated (i.e., switched on). During a read operation and a program verify operation (i.e., a "target cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage (Vt) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass through to the sense amplifier. To achieve this, a pass through voltage (Vpass) can be applied to the wordlines of the unread cells to keep the unread cells on. More specifically, Vpass is a voltage that is chosen to be higher than all of the Vt's of the unread cells, but lower than a programming voltage, to ensure a memory cell is switched on. Although Vpass is a lower voltage than the programming voltage, the application of Vpass can affect (e.g., increase) the threshold voltage and thus alter logic states of the unread cells of the block via tunneling currents. This phenomenon is referred to as "read disturb." As more read operations are applied within the block, the accumulation of read disturb over time can lead to read disturb errors.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., the pass through voltage, which is less than the programming voltage. After each programming pulse, or after a number of programming pulses, a program verify operation can be performed to determine if the threshold voltage of the one or more memory cells has increased to a desired programming level.

Cells of a memory array that are selected for execution of a memory access operation (e.g., a read operation, a program operation, an erase operation) can be referred to target cells connected to a target wordline. The target cells can be adjacent to cells connected to at least one wordline neighboring the target wordline ("adjacent wordline"). For example, the at least one adjacent wordline can be a single wordline neighboring the target wordline or a pair of wordlines neighboring the target wordline. Illustratively, the target wordline can be referred to as an nth wordline (WLn), and the at least one adjacent wordline can include at least one of adjacent wordline n−1 (WLn−1) or adjacent wordline n+1 (WLn+1). For example, in a 3D memory device, the set of adjacent wordlines can include a wordline located directly above the target wordline and/or a wordline located directly below the target wordline.

Each target cell has a respective group of adjacent cells. Each group of adjacent cells includes at least one cell that neighbors its respective target cell (e.g., one cell connected to WLn−1 and/or one cell connected to WLn+1). More specifically, each target cell can be connected to the same bitline as each cell of the respective group of adjacent cells, such that the target cell and the cells of the respective group of adjacent cells are within the same string. Accordingly, each group of adjacent cells can include a single adjacent cell, or a pair of adjacent cells connected to a same bitline as a respective target cell.

During the ramping of the pass through and program voltages, a potential difference between the source and the drain (i.e., a lateral electric field) can form and cause residue electrons to be trapped at wordlines. These residue electrons can contribute to program disturb in a number of ways. For example, regular data wordlines (i.e., wordlines lower down the string) can suffer from hot-electron ("hot-e") disturb where a large voltage differential between the gate and source causes the residue electrons to be injected from a drain depletion region into the floating gate. It is desirable to suppress the hot-e formation during pass through and program voltage ramping during a program inhibit operation. In certain systems, one or more edge wordlines suffer from significant hot-e disturb as compared to other wordlines due to a strong lateral e-field resulting from the source-side having a large number of erased wordlines as compared to the drain-side.

The hot-e disturb activated by the lateral e-field can result in cell-to-cell interference (also referred to as "C2C interference") in a memory array between the target cells and their respective groups of adjacent cells. Cell-to-cell interference can lead to lateral charge migration and Vt distribution shift. Cell-to-cell interference, in addition to intrinsic charge loss, can further lead to a widening of $V_T$ distributions. The $V_T$ distribution widening can cause RWB degradation, which can negatively affect memory device reliability. For example, RWB degradation can lead to an increase in the number of errors (e.g., bit errors) and/or error rate (e.g., bit error rate (BER)).

Aspects of the present disclosure address the above and other deficiencies by adjusting or boosting one or more drain-side wordlines to a first adjusted pass through voltage (also referred to as an "adjusted Vpass1") which is higher than a second pass through voltage (Vpass2) applied to one or more source-side wordlines during execution of a program inhibit sub-operation of a programming operation to program a target wordline (WLn). According to embodiments, the first adjusted pass through voltage (adjusted Vpass1) level is established by increasing a pass through voltage level (Vpass) by a first delta Vpass level (Delta_Vpass1). In an embodiment, the first adjusted pass through voltage level is applied to a portion of the drain-side wordlines (e.g., WLn−2 and WLn−3).

Advantageously, increasing the drain-side potential (e.g., applying the adjusted Vpass1 to the portion of the drain-side wordlines) prior to increasing a pass through voltage applied to a set of source-side wordlines (e.g., WLn+1, WLn+2, WLn+3, etc.) enables residual electrons to move from the drain-side to the source-side while the programming voltage level applied to the target wordline (WLn) is at the pass through voltage level (Vpass). This results in a reduction in the lateral e-field during execution of a program inhibit sub-operation of the programming of the target wordline (WLn) of a memory device. In an embodiment, the first adjusted pass through voltage (e.g., an increased pass through voltage level) is applied to the portion of the drain-side wordlines (e.g., WLn−2 and WLn−3) prior to ramping the programming voltage (Vpgm) applied to the target wordline from the pass through voltage level (Vpass) to the target programming voltage level (Vpgm_final).

According to embodiments, when the program voltage level applied to the target wordline is ramped from the pass through voltage level (Vpass) to the target programming level (Vpgm_target), a reduced amount of residual electrons remain on the drain-side (e.g., as compared to certain approaches in which a symmetrical pass through voltage is applied to both the drain-side and the source-side). This reduction in the amount of residual electrons advantageously reduces the level of disturb on the target wordline (WLn). In addition, according to aspects of the present disclosure, applying the first adjusted pass through voltage (adjusted Vpass1=Vpass+Delta_Vpass1) to the selected portion of the set of drain-side wordlines suppresses the hot-electron level during the program voltage ramping by reducing the potential difference (e.g., the lateral e-field) between the source and drain during the program inhibit sub-operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IOT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The local media controllers 135 can implement a pass through voltage manager 134 that can manage pass through voltage levels applied to drain-side wordlines (e.g., WLn−1, WLn−2, WLn−3, etc.) and source-side wordlines (e.g., WLn+1, WLn+2, WLn+3, etc.) during execution of programming operation to program a target wordline (WLn) of a memory device, such as memory device 130. The pass through voltage manager 134 can apply a first adjusted pass through voltage (adjusted Vpass1) to a selected portion (e.g., WLn−2 and WLn−3) of a set of drain-side wordlines which is higher than a pass through voltage level (Vpass) and a second pass through voltage (Vpass2) applied to one or more source-side wordlines during execution of a programming operation to program the target wordline (WLn). According to embodiments, the first adjusted pass through voltage (adjusted Vpass1) level is applied to the selected portion of drain-side wordlines (e.g., WLn−2 and WLn−3) to inhibit programming of those wordlines during programming of the target wordline (WLn). In an embodiment, the pass through voltage manager 134 establishes the first adjusted pass through voltage level (adjusted Vpass1) by increasing a first pass through voltage level (Vpass1) by a first delta Vpass level (Delta_Vpass1). In an embodiment, the first adjusted pass through voltage level applied to a portion of the drain-side wordlines (e.g., WLn−2 and WLn−3) to inhibit programming of the drain-side wordlines during the programming of the target wordline can be represented by the following expression:

$$\text{Adjusted } Vpass1 = Vpass1 + \text{Delta\_Vpass1}$$

According to embodiments, the adjusted Vpass1 applied by the pass through voltage manager 134 to the selected drain-side wordlines is greater than a pass through voltage level applied to the set of source-side wordlines (e.g., Vpass or Vpass2) during the programming operation. In an embodiment, the pass through voltage manager 134 causes the adjusted Vpass1 (i.e., the increased pass through voltage level) to be applied to the selected portion of the drain-side wordlines to establish a higher pass through voltage level on the drain-side as compared to the source-side which enables residual electrons to flow from the drain-side to the source-side, thereby reducing the disturb on the target wordline.

In an embodiment, the pass through voltage manager 134 can cause the first adjusted pass through voltage (adjusted Vpass1) to be applied to the selected portion of the drain-side wordlines to be ramped down when the programming voltage applied to the target wordline reaches the target voltage level (i.e., Vpgm_target). The ramping down of the adjusted Vpass1 in this manner can advantageously reduce the C2C interference and local hot-electron (hot-e) issues.

In an embodiment, the pass through voltage manager 134 can cause a second adjusted pass through voltage (adjusted Vpass2) to be applied to the set of source-side wordlines prior to ramping the programming voltage applied to the target wordline to the target programming level (Vpgm_target). In an embodiment, the pass through voltage manager 134 establishes the second adjusted pass through voltage level (adjusted Vpass2) by decreasing a pass through voltage level (Vpass) by a second delta Vpass level (Delta_Vpass2). In an embodiment, the second adjusted pass through voltage level applied to at least a portion of the drain-side wordlines (e.g., WLn+2, WLn+3, etc.) to inhibit programming of the source-side wordlines during the programming of the target wordline can be represented by the following expression:

$$\text{Adjusted } Vpass2 = Vpass - \text{Delta\_Vpass2}$$

In an embodiment, the pass through voltage manager 134 can cause the first adjusted pass through voltage (adjusted Vpass1) to be applied to the selected portion of the drain-side wordlines prior to ramping the program voltage (Vpgm) applied to the target wordline to the pass through level (Vpass).

Figure 1B:
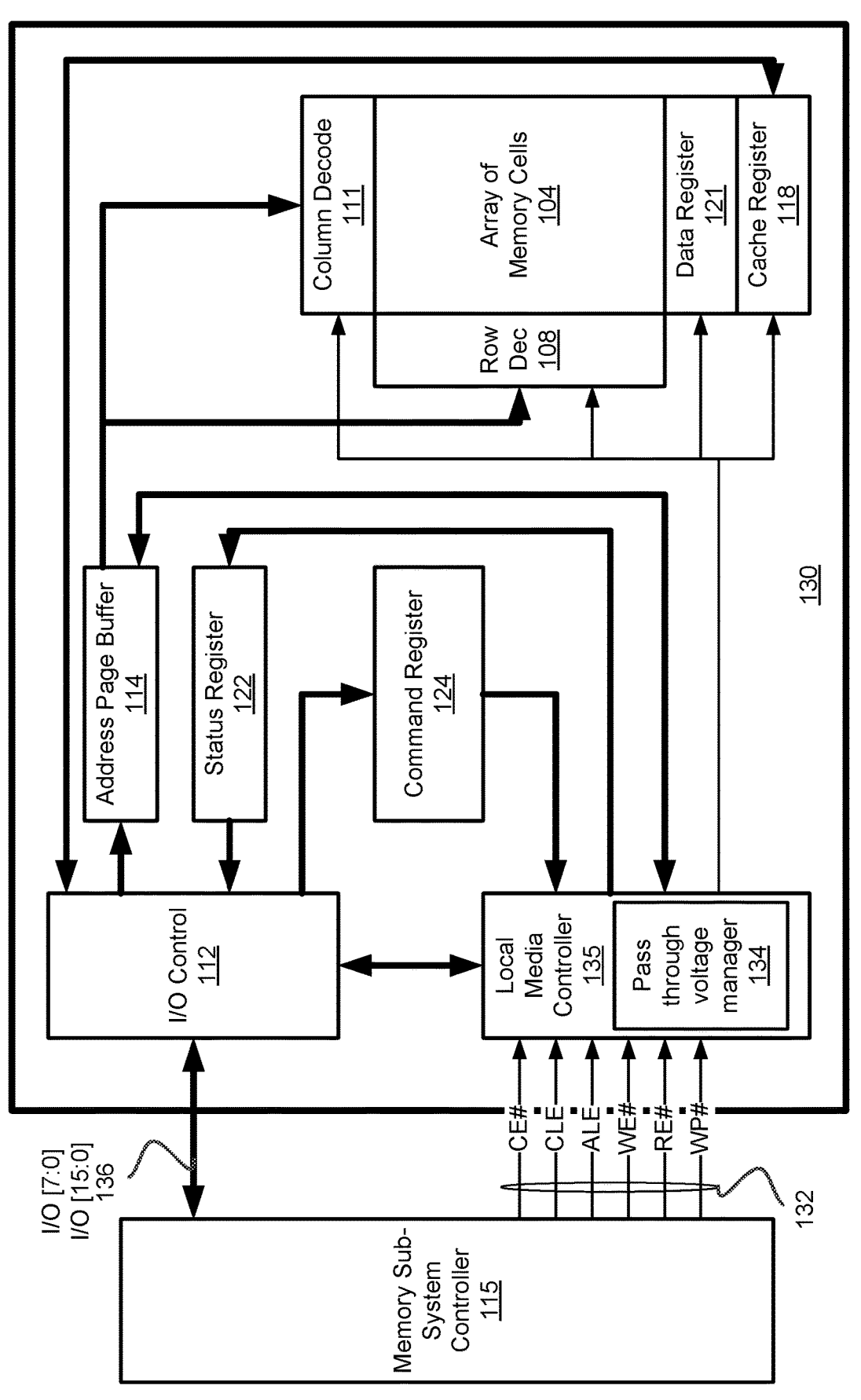
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 111 are provided to decode address signals. Address signals are received and decoded to access the array of memory cells 104. Memory device 130 also includes input/output (I/O) control circuitry 112 to manage input of commands, addresses and data to the memory device 130 as well as output of data and status information from the memory device 130. An address page buffer 114 is in communication with I/O control circuitry 112 and row decode circuitry 108 and column decode circuitry 111 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses. In one embodiment, local media controller 135 includes the pass through voltage manager 134, which can implement the execution of at least a portion of the prologue sub-operations of a programming operation during a data loading stage to reduce a total programming time associated with the programming operation of a set of target memory cells of the memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 121 for transfer to the array of memory cells 104; then new data may be latched in the cache register 118 from the I/O control circuitry 112. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device 130. A page buffer or register may further include sensing devices (not shown in FIG. 1B) to sense a data state of a memory cell of the array of memory cells 104, e.g., by sensing a state of a data line connected to that memory cell. A status register 122 may be in communication with I/O control circuitry 112 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 124. The addresses may be received over input/output (I/O) pins [7:0] of I/O bus 136 at I/O control circuitry 112 and may then be written into address page buffer 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 104.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
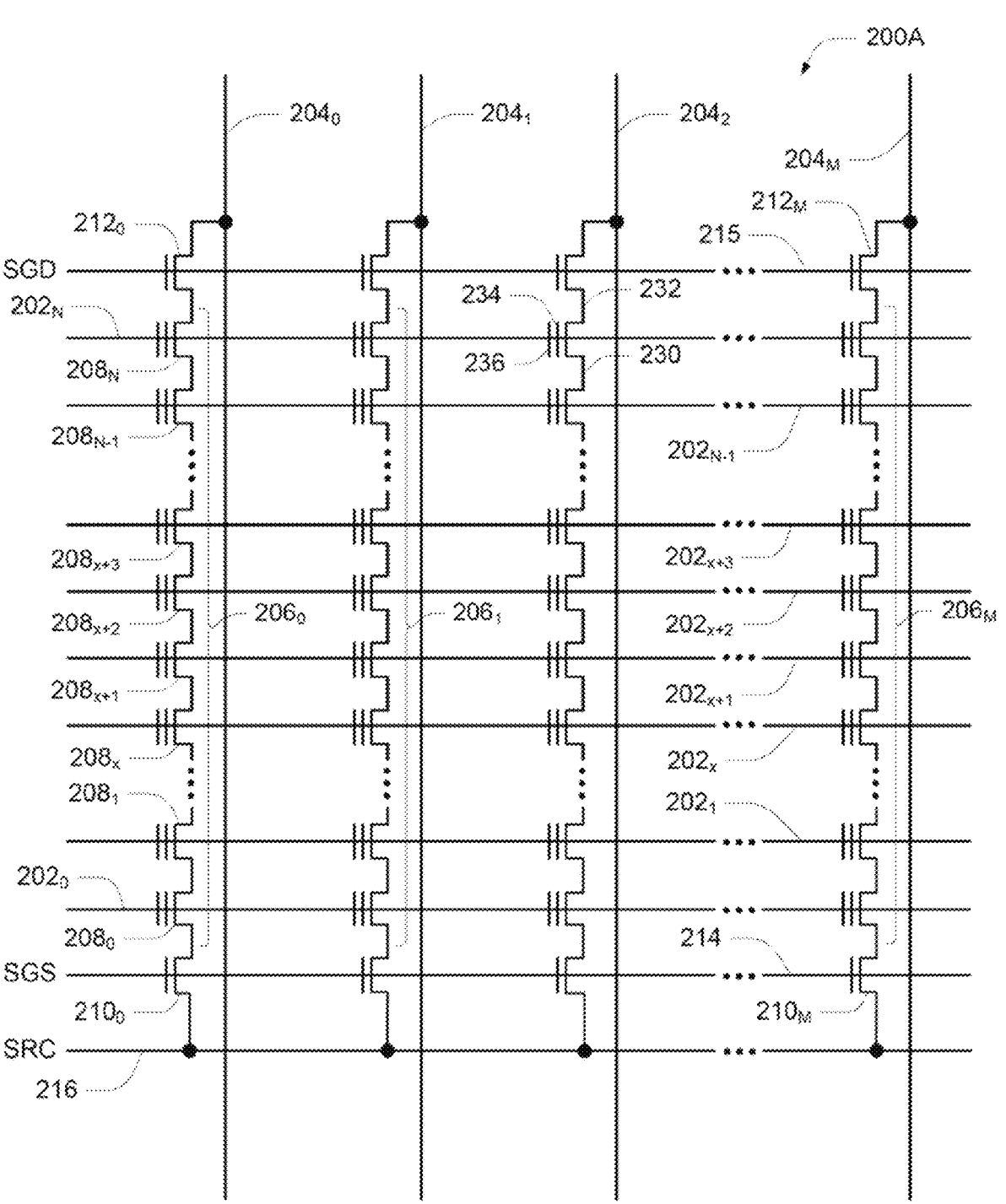
Figure 2B:
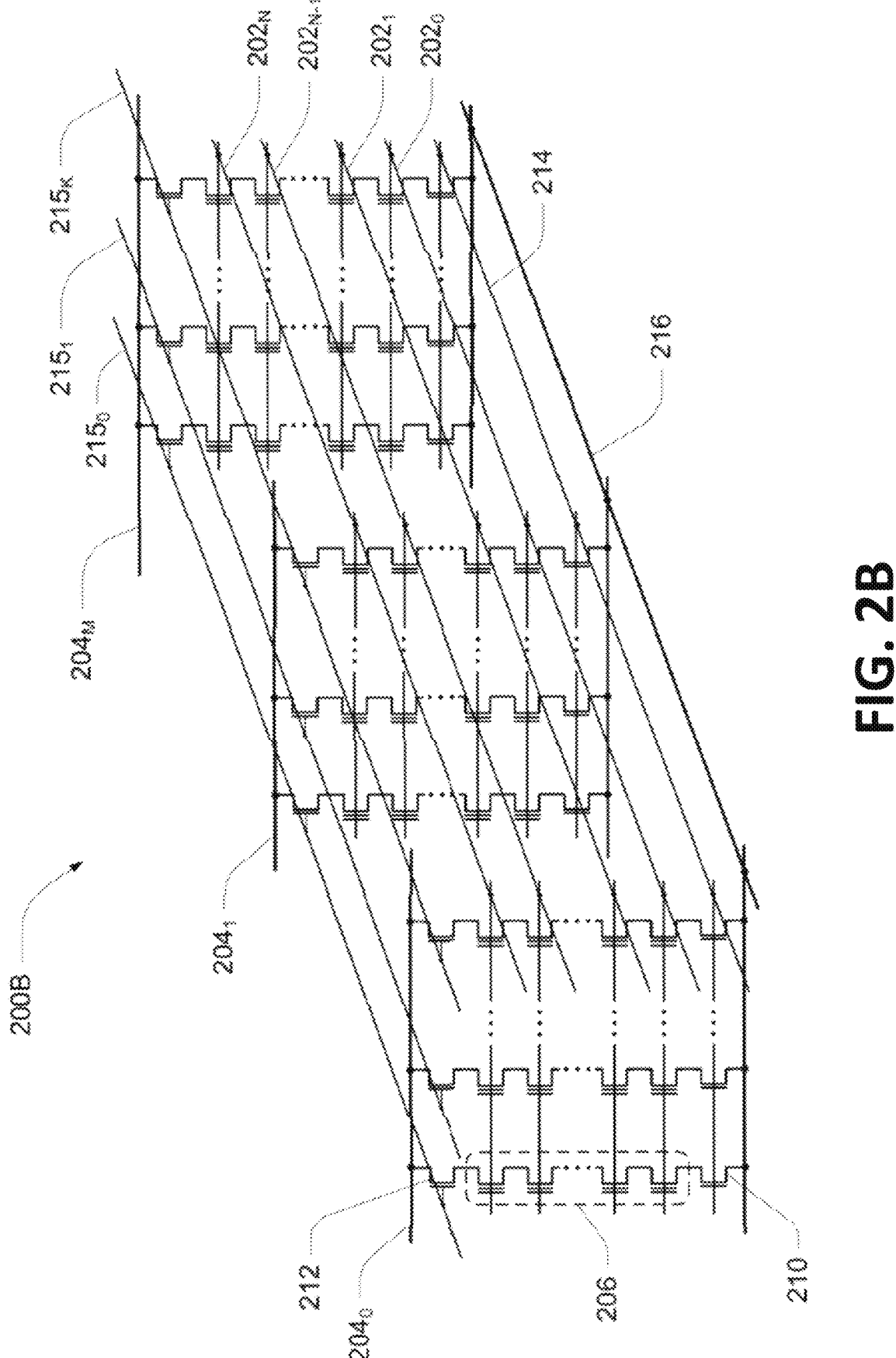
Figure 2C:
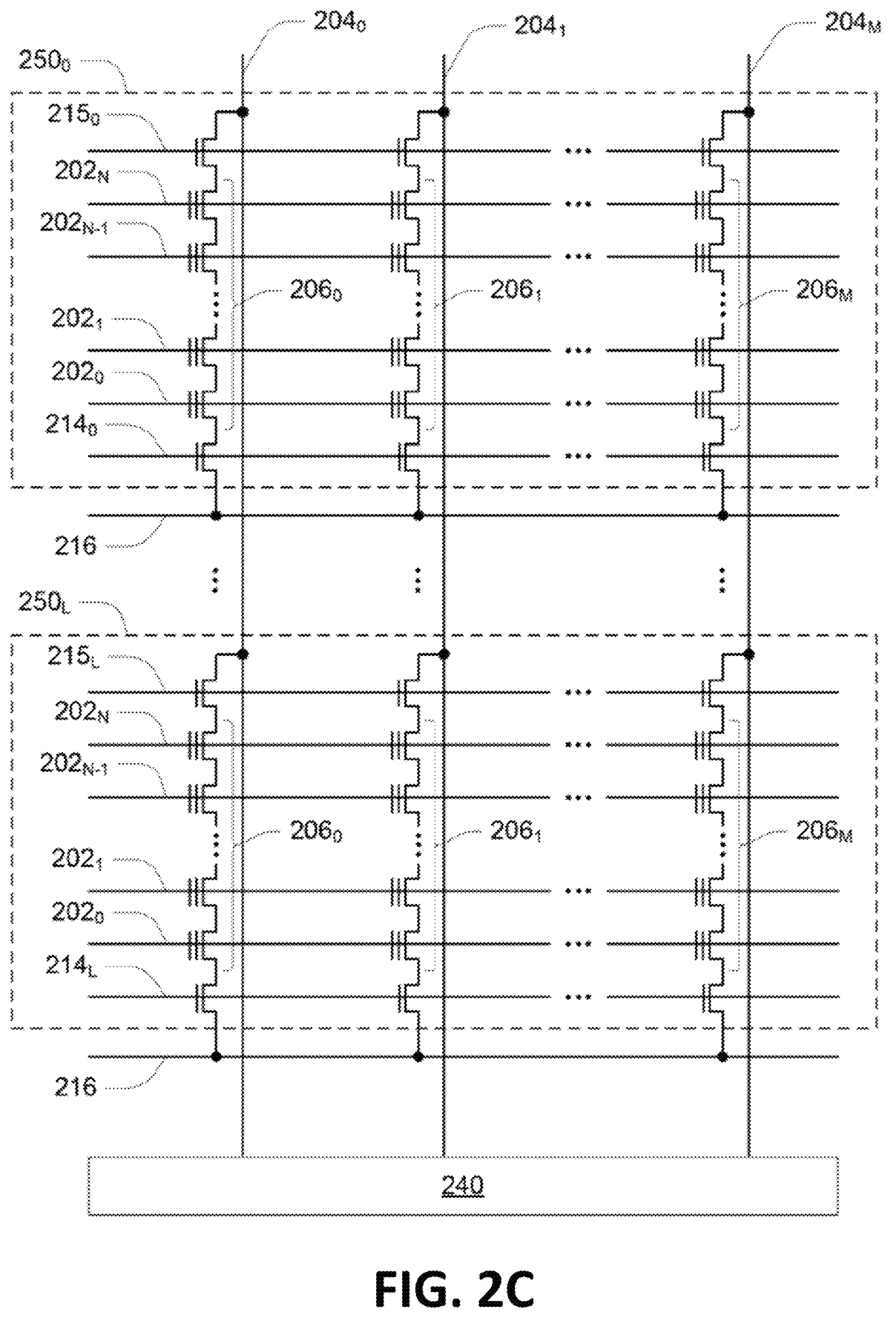

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates 212 to 212 can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_1$, to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 2D:
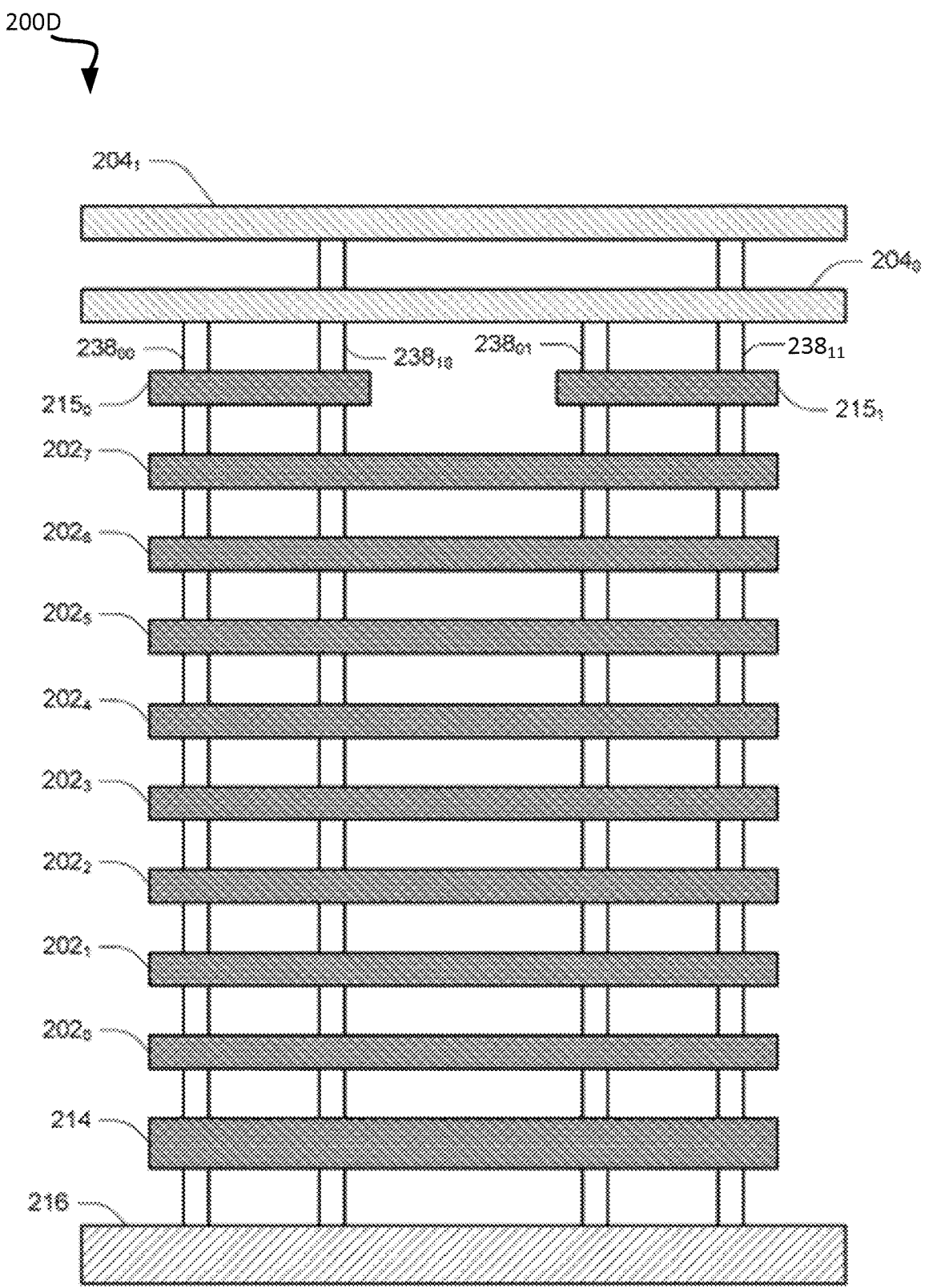

FIG. 2D is a diagram of a portion of an array of memory cells 200D (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2C) selectively connected to the bitline $204_0$. Similarly, channel regions $238_{10}$ and $238_{11}$ represent the channel regions of different strings of series-connected memory cells (e.g., NAND strings 206 of FIGS. 2A-2C) selectively connected to the bitline $204_1$. A memory cell (not depicted in FIG. 2D) may be formed at each intersection of a wordline 202 and a channel region 238, and the memory cells corresponding to a single channel region 238 may collectively form a string of series-connected memory cells (e.g., a string 206 of FIGS. 2A-2C). Additional features might be common in such structures, such as dummy wordlines, segmented channel regions with interposed conductive regions, etc.

FIG. 3 is a block schematic of an example portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
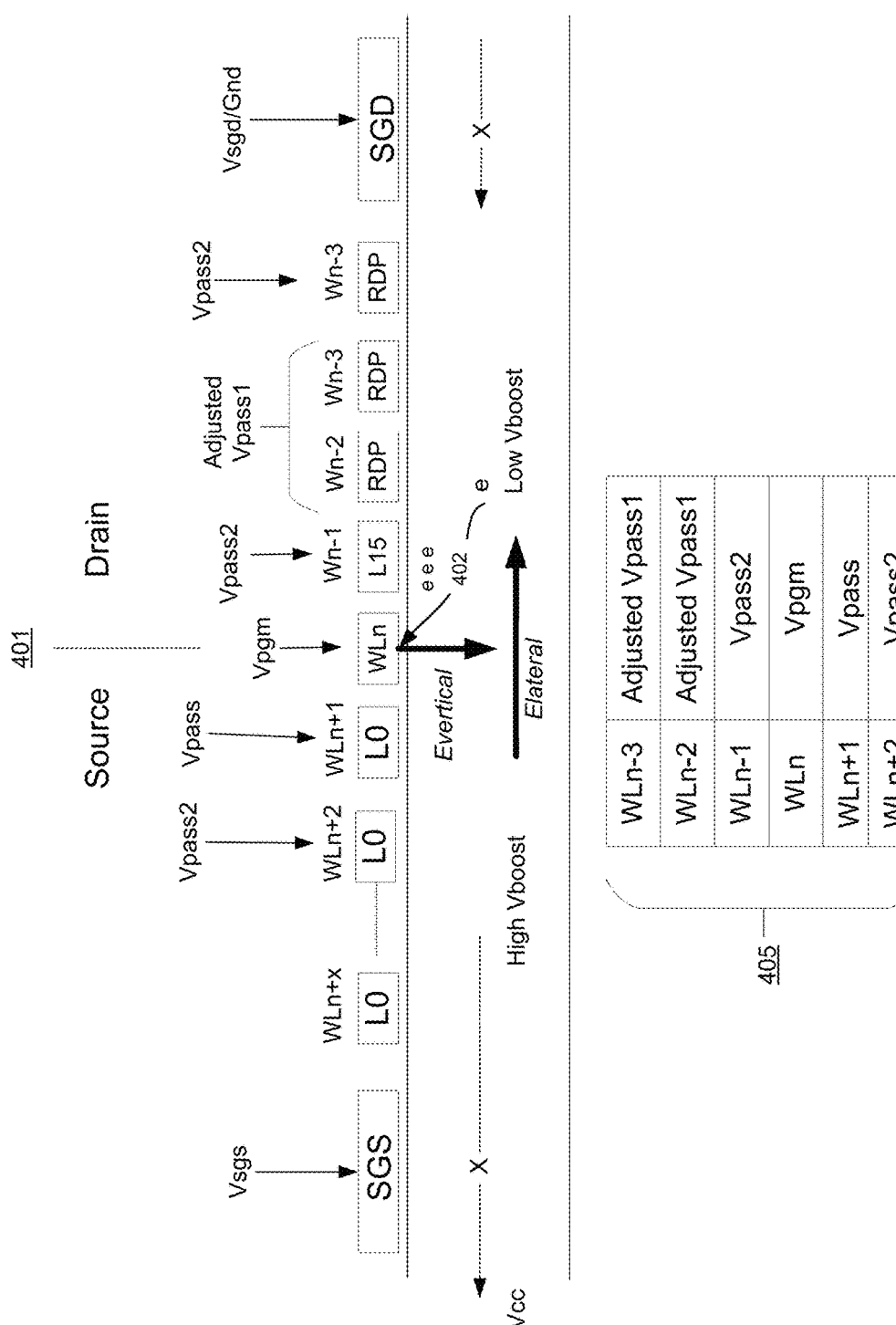
FIG. 4 illustrates an example arrangement of a target wordline, a set of source-side wordlines, and a set of drain-side wordlines during execution of a program operation to program the target wordline of a memory device, in accordance with one or more embodiments of the present disclosure.

FIG. 4 illustrates an example arrangement 401 of a target wordline (WLn), a set of source-side wordlines (e.g., WLn+1, WLn+2 . . . WLn+x), and a set of drain-side wordlines (e.g., WLn−1, WLn−2, WLn−3, etc.) during execution of a program operation to program one or more memory cells of the target wordline (WLn) of a memory device, according to one or more embodiments of the present disclosure. According to embodiments, processing logic (e.g., a pass through voltage manager 134 of FIGS. 1A and 1B) can manage pass through voltage levels applied to the set of drain-side wordlines and source-side wordlines during a program inhibit sub-operation of the programming operation. In the example illustrated in FIG. 4, WLn−1 is programmed to a target programming level (e.g., L15) while the next two adjacent drain-side wordlines (WLn−2 and WLn−3) are programmed and maintain a random data pattern (RDP). As illustrated in FIG. 4, during application of a programming voltage (Vpgm) to the target wordline (WLn), a first adjusted pass through voltage (Adjusted Vpass1) is applied to a selected portion of the drain-side wordlines (e.g., WLn−2 and WLn−3), where the adjusted Vpass1 is established by increasing a first pass through voltage level (Vpass1) by a delta voltage level (Delta_Vpass1). In this example, the adjusted Vpass1 is represented by the following expression:

$$\text{Adjusted } Vpass1 = Vpass1 + \text{Delta\_Vpass1}$$

According to embodiments, an example Delta_Vpass1 can be approximately 1V to 2V, an example Vpass1 is approximately 9V to 10V, and an example adjusted Vpass1 is approximately 10V to 12V. As shown in FIG. 4, the increasing of the drain-side potential earlier than the source-side potential enables at least a portion of the residual electrons (e) to move 402 from the drain-side to the source-side while the programming voltage applied to the target wordline (WLn) is at a pass through level (Vpass). The reduction in the residual electrons when the programming voltage ramps from the Vpass level to the target programming level (Vpgm_target) enables a reduction in the disturb on the target wordline (WLn).

According to embodiments, table 405 illustrates example voltage levels applied to drain-side wordlines (e.g., WLn−1, WLn−2, and WLn−3), source-side wordlines (e.g., WLn+1 and WLn+2), and the target wordline (WLn). As illustrated, during the programming operation using a drain-to-source programming sequence, the adjusted Vpass1 is applied to the selected portion of the drain-side wordlines (e.g., WLn−2 and WLn−3), Vpgm is applied to the target wordline (WLn), a second pass through voltage (Vpass2) is applied to WLn−1 and WLn+2, and a default pass through voltage (Vpass) is applied to WLn+1. According to embodiments, the relationship between the pass through voltage levels can be expressed as follows:

$$\text{Adjusted } Vpass1 > Vpass2 > Vpass$$

The example programming operation illustrated in FIG. 4 is a drain-to-source programming scheme. It is noted that, according to embodiments of the present disclosure, a source-to-drain programming scheme can be employed. In a source-to-drain programming scheme, the adjusted Vpass1 (e.g., a higher pass through voltage level) is applied to a selected portion of the source-side wordlines to raise the source-side potential to a higher level as compared to the drain-side potential.

Figure 5:
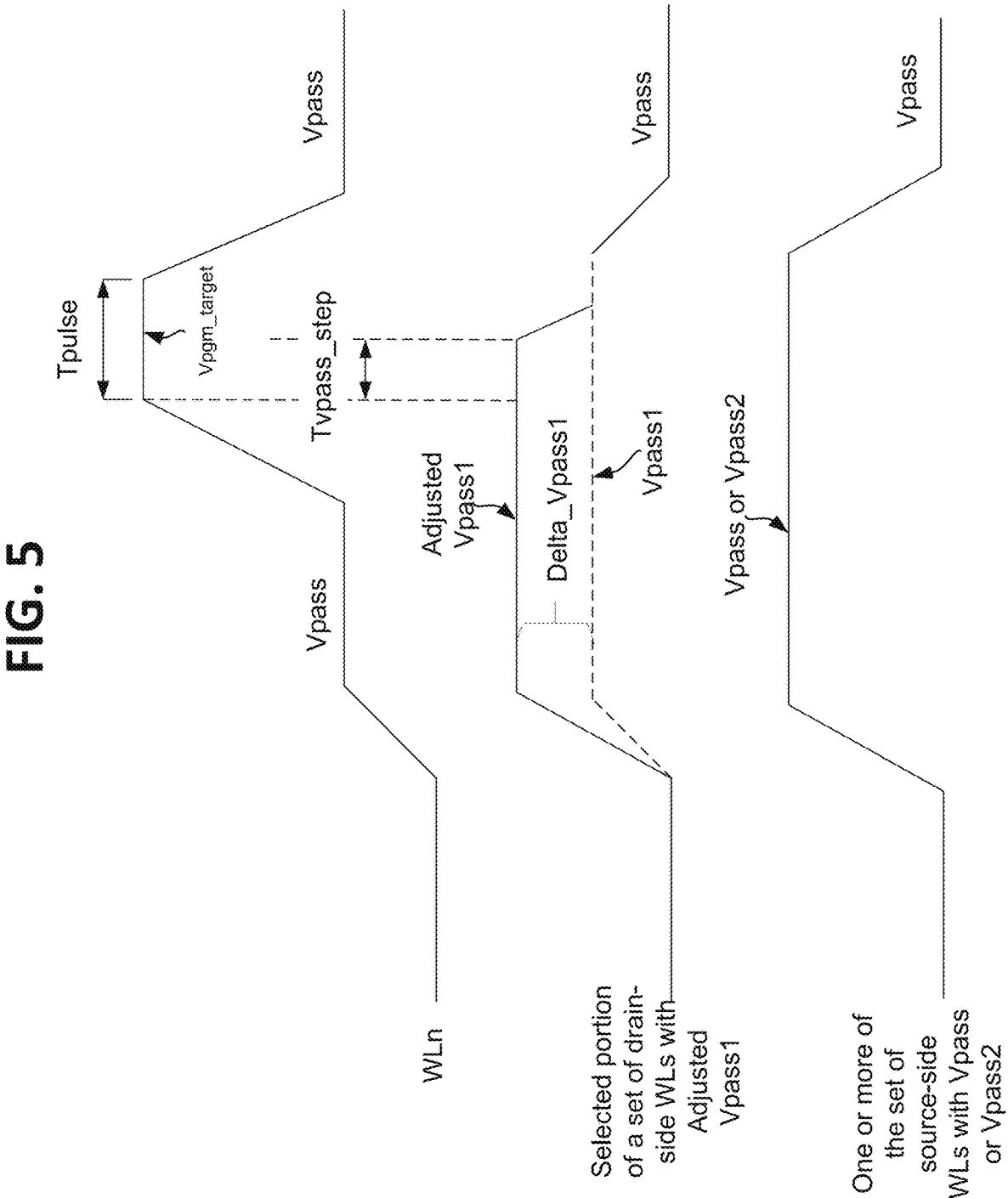
FIG. 5 illustrates example waveforms associated with managing pass through voltage levels applied to drain-side wordlines and source-side wordlines during execution of a programming operation to program one or more memory cells of a target wordline of a memory device, in accordance with one or more embodiments of the present disclosure.

FIG. 5 illustrates example waveforms associated with managing pass through voltage levels applied to drain-side wordlines and source-side wordlines during execution of a programming operation to program one or more memory cells of a target wordline (WLn) of a memory device, in accordance with one or more embodiments of the present disclosure. As illustrated in FIG. 5, during execution of the programming operation and the application of a programming voltage to the target wordline (WLn), an adjusted Vpass1 is applied to a selected portion of a set of drain-side wordlines. In an embodiment, the selected set includes, for example, WLn−2 and WLn−3. As described above, the adjusted Vpass1 can be determined in accordance with the following expression:

$$\text{Adjusted } Vpass1 = Vpass1 + \text{Delta\_Vpass1}$$

According to embodiments, the delta_Vpass1 can be in a range of approximately 1V to approximately 2V. As shown in FIG. 5, a different pass through voltage (e.g., Vpass or Vpass2) is applied to the at least a portion of the set of source-side wordlines, where the adjusted Vpass1 is greater than Vpass and Vpass2. Advantageously, increasing the pass through voltage applied to the selected set of drain-side wordlines to the adjusted Vpass1 level increases the drain-side potential earlier as compared to the source-side potential. This earlier increase in potential on the drain-side enables residual electrons on the drain-side to move to the source-side while the programming voltage applied to the target wordline (WLn) is at the pass through level (Vpass) and reduces the disturb on the target wordline. As illustrated, the adjusted Vpass 1 is applied to the selected portion of the set of drain-side wordlines (based on a drain-to-source programming sequence) prior to ramping the programming voltage (Vpgm) to the target programming level (Vpgm_target).

As shown in FIG. 5, in an embodiment, while the Vpgm is at the Vpgm_target level (e.g., during the pulse time (Tpulse)), the pass through voltage applied to the selected portion of the drain-side wordlines can be ramped down from the adjusted Vpass1 level to a default pass through level (Vpass). As illustrated, the ramping down of the adjusted Vpass1 level of the selected set of drain-side wordlines can occur following a step-down time period (Tvpass_step) initiated at a start of the Tpulse. In an embodiment, the Tvpass_step is less than the Tpulse to avoid increasing a total programming time (e.g., Tprog).

Figure 6:
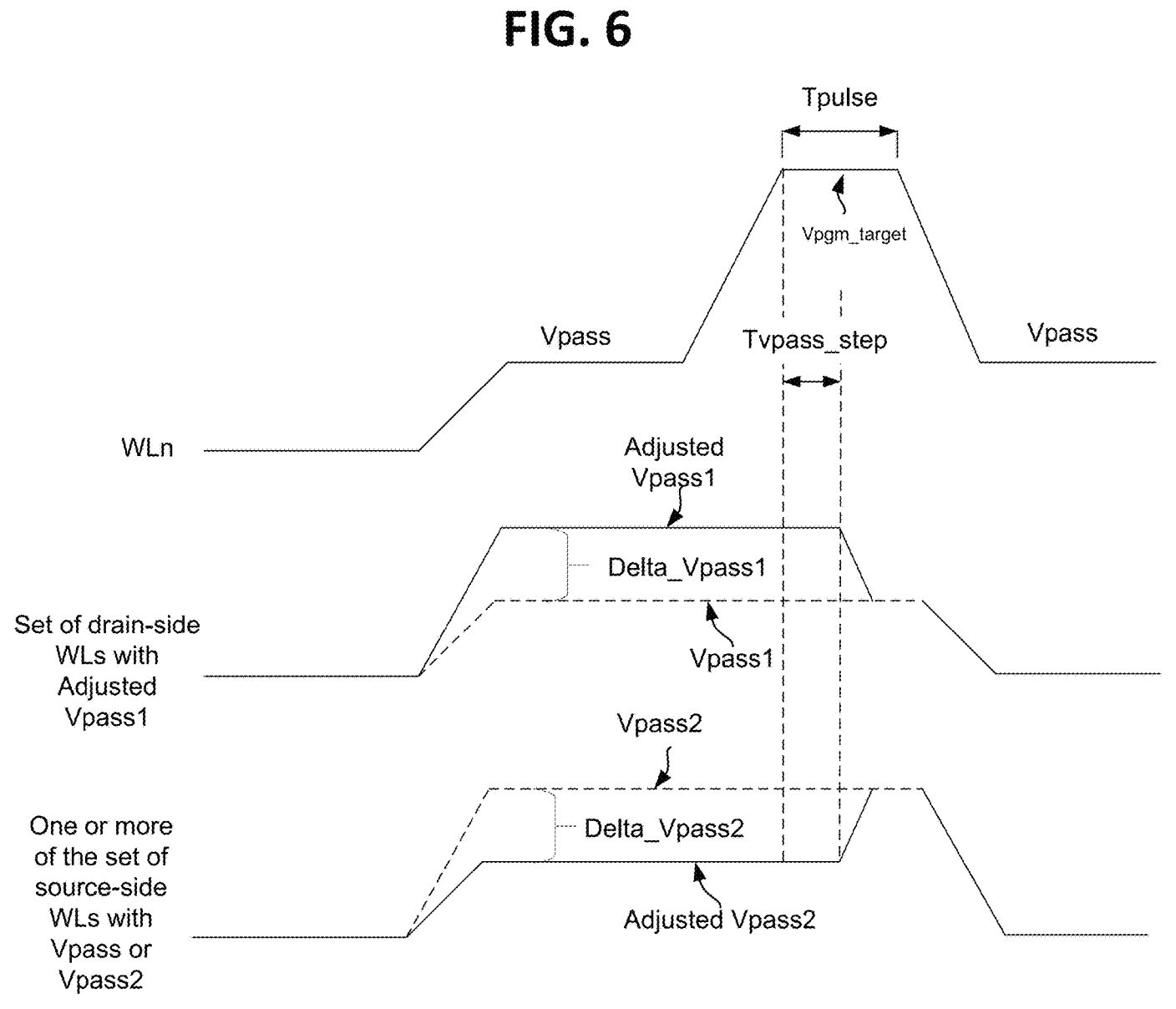

FIG. 6 illustrates example waveforms associated with managing pass through voltage levels applied to drain-side wordlines and source-side wordlines during execution of a programming operation to program a target wordline (WLn) of a memory device, in accordance with one or more embodiments of the present disclosure. As illustrated in FIG. 6, during execution of the programming operation and the application of a programming voltage to the target wordline (WLn), an adjusted Vpass1 is applied to a selected portion of a set of drain-side wordlines. In an embodiment, during the programming operation, a second adjusted pass through voltage is applied to at least a portion of the source-side wordlines.

In an embodiment, the second adjusted pass through voltage level is established by reducing a default pass through voltage (Vpass2) by a delta voltage level (Delta_Vpass2). In an embodiment, the second adjusted pass through voltage (Adjusted Vpass2) is represented by the following expression:

$$\text{Adjusted } Vpass2 = Vpass2 - \text{Delta\_Vpass2}$$

In an example, the Delta_Vpass2 can be in a range of approximately 0.3V to approximately 1.5V. In an embodiment, the adjusted Vpass2 can be applied to one or more of the set of source-side wordlines (e.g., WLn+2, WLn+3, etc.) prior to ramping the programming voltage applied to the target wordline to the target programming level (Vpgm_target). As described above, the adjusted Vpass1 level applied to the portion of the drain-side wordlines can be ramped down or reduced to a default pass through level (Vpass1) associated with drain-side wordlines following the Tvpass_step time period after initiation of the programming pulse. In an embodiment, the adjusted Vpass2 applied to the one or more of the source-side wordlines can be ramped up or increased to a default pass through voltage (Vpass2) associated with the source-side wordlines following the Tvpass_step time period after initiation of the programming pulse. According to embodiments, Delta_Vpass1 is greater than Delta_Vpass2.

Figure 7:
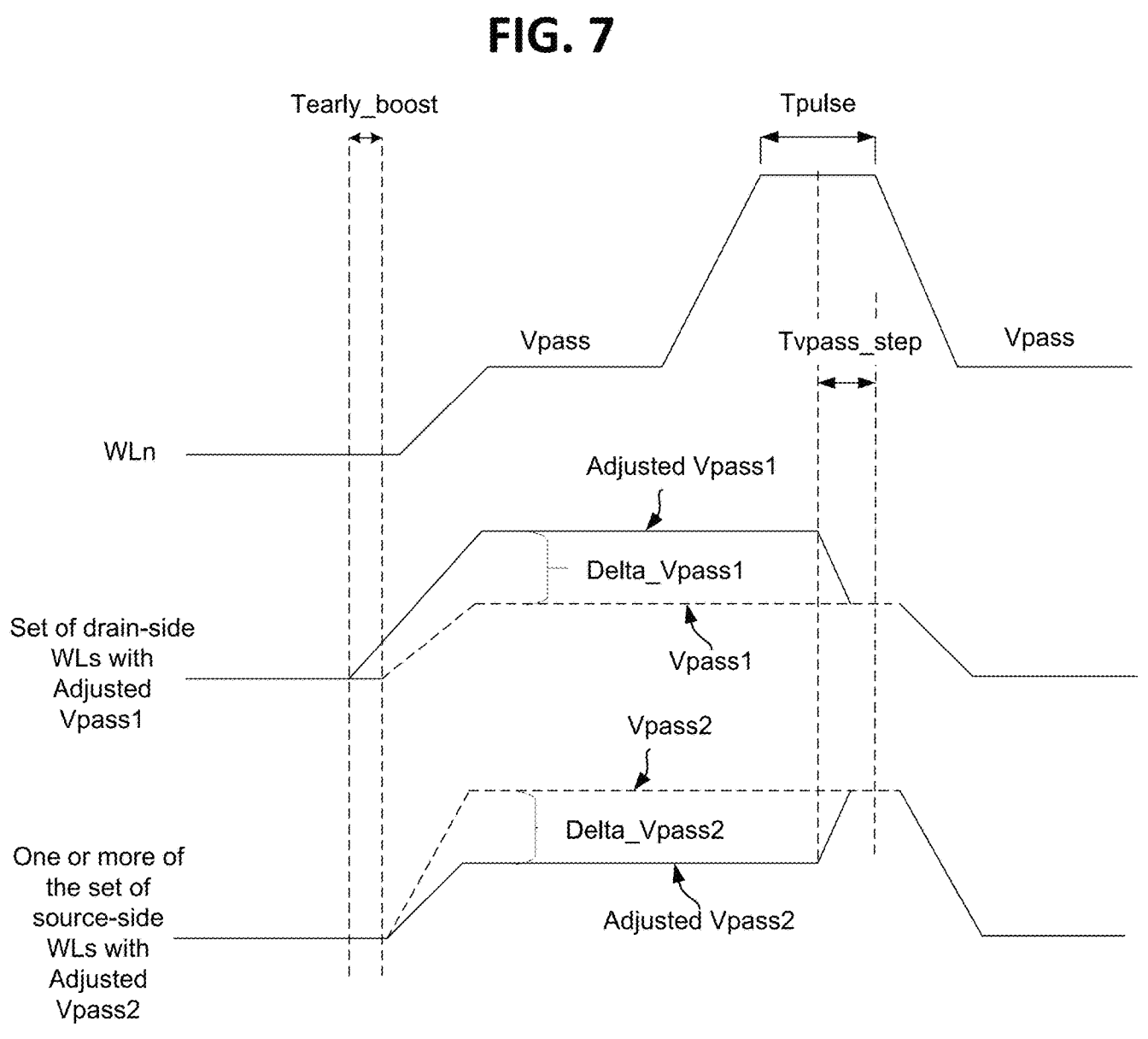

FIG. 7 illustrates example waveforms associated with managing pass through voltage levels applied to drain-side wordlines and source-side wordlines during execution of a programming operation to program a target wordline (WLn) of a memory device, in accordance with one or more embodiments of the present disclosure. As illustrated in FIG. 7, during execution of the programming operation and the application of a programming voltage to the target wordline (WLn), an adjusted Vpass1 is applied to a selected portion of a set of drain-side wordlines before the programming voltage applied to the target wordline (WLn) is ramped to a pass through voltage level (Vpass). In an embodiment, the application of the adjusted Vpass1 to the selected set of drain-side wordlines is initiated at a start of an early boost time period (Tearly_boost), as illustrated. At the end of the early boost time period (Tearly_boost), the ramping of the programming voltage applied to the target wordline to the pass through voltage level (Vpass) is initiated.

As illustrated, during the programming operation, a second adjusted pass through voltage is applied to at least a portion of the source-side wordlines after the Tearly_boost time period. Accordingly, as illustrated, the selected portion of the set of drain-side wordlines are ramped to the adjusted Vpass1 voltage level first (i.e., at a start of the Tearly_boost time period) and the other wordlines (e.g., the target wordline and the source-side worldlines) are ramped to respective pass through voltage levels after the Tearly_boost time period.

FIG. 8 is a flow diagram of an example method 800 to manage pass through voltage levels applied to a set of drain-side wordlines and a set of source-side wordlines during execution of a programming operation to program a target wordline of a memory device, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the pass through voltage manager 134 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a request is identified. For example, processing logic (e.g., the pass through voltage manager 134 of FIGS. 1A-1B) can identify a request to execute a programming operation to program multiple sub-blocks including a first sub-block and a second sub-block of a memory device. In an embodiment, the request for the programming operation (e.g., a ganged programming operation to program multiple sub-blocks concurrently) is received from a host system. In an embodiment, as described in detail above with respect to FIGS. 4-7, the programming operation can be executed in accordance with a drain-to-source programming sequence.

At operation 820, a first voltage is applied. For example, the processing logic can cause, at a first time during application of a programming voltage to the target wordline, a first adjusted pass through voltage to be applied to a first portion of a first set of drain-side wordlines of the memory device. In an embodiment, the first portion of the first set of drain-side wordlines can include one or more wordlines (e.g., WLn−2, WLn−3) on the drain side of the target wordline (WLn) in a drain-to-source programming scheme. In an embodiment, the first adjusted pass through voltage is established by increasing a default programming level (e.g., Vpass1) by a first delta Vpass level (Delta_Vpass1)).

At operation 830, a second voltage is applied. For example, the processing logic can cause, at a second time during application of the programming pulse to the target wordline, a second pass through voltage to be applied to a second portion of the first set of drain-side wordlines and one or more source-side wordlines of the memory device, where the first adjusted pass through voltage is greater than the second pass through voltage.

In an embodiment, the second pass through voltage can be established by reducing a default pass through voltage level (Vpass2) by a second delta Vpass level (Delta_Vpass2). In this embodiment, a first potential on the drain-side is raised or increased by way of application of the first adjusted pass through voltage level (Adjusted_Vpass1) as compared to a second potential on the source-side of the target wordline.

Figure 9:
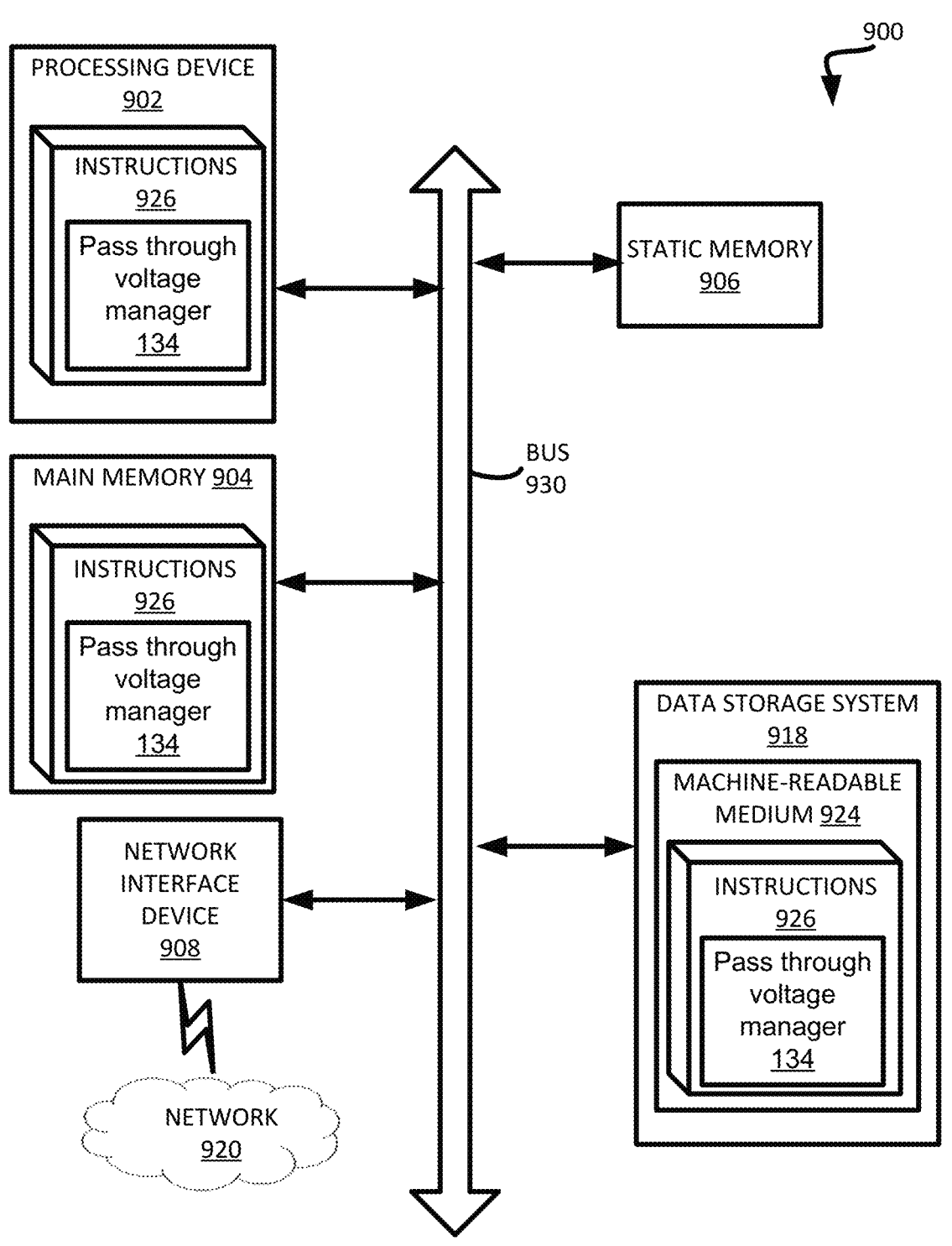
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the pass through voltage manager 134 of FIGS. 1A, 1B, 4 and 5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or RDRAM, etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a program manager (e.g., the pass through voltage manager 134 of FIG. 1A and FIG. 1B). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's page buffers and memories into other data similarly represented as physical quantities within the computer system memories or page buffers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array; and control logic, operatively coupled with the memory array, to perform operations comprising:

identifying a request to execute a programming operation to program a set of memory cells associated with a target wordline of the memory array;

causing, prior to application of a programming pulse of the programming operation to the target wordline, a first adjusted pass through voltage to be applied to a first portion of a first set of drain-side wordlines of the memory device, wherein the first adjusted pass through voltage is a first default pass through voltage increased by a first delta voltage level; and causing, prior to the application of the programming pulse of the programming operation to the target wordline, a second pass through voltage to be applied to a second portion of the first set of drain-side wordlines and to one or more source-side wordlines of the memory device, wherein the first adjusted pass through voltage is greater than the second pass through voltage; and causing, during application of a target programming voltage level to the target wordline, a ramping down of the first adjusted pass through voltage applied to the first portion of the first set of drain-side wordlines to the first default pass through voltage.

2. The memory device of claim 1, wherein the second pass through voltage is a second default pass through voltage level reduced by a second delta voltage level.

3. The memory device of claim 2, wherein the first delta voltage level is greater than the second delta voltage level.

4. The memory device of claim 1, wherein the first adjusted pass through voltage is applied to the first portion of the first set of drain-side wordlines during application of the second pass through voltage to the target wordline.

5. The memory device of claim 1, wherein the first adjusted pass through voltage is ramped down to the first default pass through voltage level after a step-down time period initiated at a start of a pulse time of the programming pulse.

6. The memory device of claim 1, the operations further comprising ramping up the second pass through voltage to a second default pass through voltage level in response to the application of the programming pulse of the programming operation to the target wordline.

7. A method comprising:

identifying, by a processing device, a request to execute a programming operation to program a set of memory cells associated with a target wordline of a memory device;

causing, prior to application of a programming pulse of the programming operation to the target wordline at a first time during application of a programming voltage to the target wordline, a first adjusted pass through voltage to be applied to a first portion of a first set of drain-side wordlines of the memory device, wherein the first adjusted pass through voltage is a first default pass through voltage increased by a first delta voltage level;

causing, prior to the application of the programming pulse of the programming operation to the target wordline at a second time during application of the programming voltage to the target wordline, a second pass through voltage to be applied to a second portion of the first set of drain-side wordlines and to one or more source-side wordlines of the memory device, wherein the first adjusted pass through voltage is greater than the second pass through voltage; and causing, during application of a target programming voltage level to the target wordline, a ramping down of the first adjusted pass through voltage applied to the first portion of the first set of drain-side wordlines to the first default pass through voltage.

8. The method of claim 7, wherein the second pass through voltage is a second default pass through voltage level reduced by a second delta voltage level.

9. The method of claim 8, wherein the first delta voltage level is greater than the second delta voltage level.

10. The method of claim 7, wherein the first adjusted pass through voltage is applied to the first portion of the first set of drain-side wordlines during application of the second pass through voltage to the target wordline.

11. The method of claim 7, wherein the first adjusted pass through voltage is ramped down to the first default pass through voltage level after a step-down time period initiated at a start of a pulse time of the programming pulse.

12. The method of claim 7, further comprising ramping up the second pass through voltage to a second default pass through voltage level in response to the application of the programming pulse of the programming operation to the target wordline.

13. A non-transitory computer readable medium comprising instructions, which when executed by a processing device, cause the processing device to perform operations comprising:

identifying a request to execute a programming operation to program a set of memory cells associated with a target wordline of a memory device;

causing, prior to application of a programming pulse of the programming operation to the target wordline at a first time during application of a programming voltage to the target wordline, a first adjusted pass through voltage to be applied to a first portion of a first set of drain-side wordlines of the memory device, wherein the first adjusted pass through voltage is a first default pass through voltage increased by a first delta voltage level;

causing, prior to the application of the programming pulse of the programming operation to the target wordline at a second time during application of the programming voltage to the target wordline, a second pass through voltage to be applied to a second portion of the first set of drain-side wordlines and to one or more source-side wordlines of the memory device, wherein the first adjusted pass through voltage is greater than the second pass through voltage; and causing, during application of a target programming voltage level to the target wordline, a ramping down of the first adjusted pass through voltage applied to the first portion of the first set of drain-side wordlines to the first default pass through voltage.

14. The non-transitory computer readable medium of claim 13, wherein the second pass through voltage is a second default pass through voltage level reduced by a second delta voltage level.

15. The non-transitory computer readable medium of claim 14, wherein the first delta voltage level is greater than the second delta voltage level.

16. The non-transitory computer readable medium of claim 13, wherein the first adjusted pass through voltage is applied to the first portion of the first set of drain-side wordlines during application of the second pass through voltage to the target wordline.

17. The non-transitory computer readable medium of claim 13, the operations further comprising:

the first adjusted pass through voltage is ramped down to the first default pass through voltage level after a step-down time period initiated at a start of a pulse time of the programming pulse; and ramping up the second pass through voltage to a second default pass through voltage level in response to the application of the programming pulse of the programming operation to the target wordline.

* * * * *